(12) United States Patent
Kim et al.

(10) Patent No.: US 10,049,728 B2
(45) Date of Patent: Aug. 14, 2018

(54) SEMICONDUCTOR MEMORY DEVICE HAVING BIT CELLS

(71) Applicant: SAMSUNG ELECTRONICS CO., LTD., Suwon-si, Gyeonggi-Do (KR)

(72) Inventors: Hoonki Kim, Seoul (KR); Jonghoon Jung, Seongnam-si (KR); Yongho Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/611,274

(22) Filed: Jun. 1, 2017

(65) Prior Publication Data

US 2018/0068715 A1 Mar. 8, 2018

(30) Foreign Application Priority Data

Sep. 2, 2016 (KR) .................. 10-2016-0113339

(51) Int. Cl.
*G11C 11/419* (2006.01)

(52) U.S. Cl.
CPC .................. *G11C 11/419* (2013.01)

(58) Field of Classification Search
CPC .............................. G11C 5/147; G11C 11/419
USPC .................................................. 365/154, 226
See application file for complete search history.

(56) References Cited

U.S. PATENT DOCUMENTS

| 7,092,280 | B2 | 8/2006 | Joshi |
| 7,324,368 | B2 | 1/2008 | Wang et al. |
| 7,447,058 | B2 | 11/2008 | Maki et al. |
| 7,474,583 | B2 | 1/2009 | Yamamura |
| 7,492,627 | B2 * | 2/2009 | Russell ............... G11C 8/16 365/154 |
| 7,511,988 | B2 | 3/2009 | Lin et al. |
| 7,852,661 | B2 | 12/2010 | Liu |
| 8,531,873 | B2 | 9/2013 | Teman et al. |
| 8,665,654 | B2 * | 3/2014 | Cheng ............... G11C 5/147 365/185.2 |
| 9,001,546 | B2 * | 4/2015 | Chen ............... G11C 7/12 365/154 |
| 9,177,636 | B1 * | 11/2015 | Dwivedi ............ G11C 11/413 |
| 2012/0014171 | A1 * | 1/2012 | Chuang ............ G11C 11/412 365/154 |
| 2015/0146480 | A1 * | 5/2015 | Chen ............... G11C 11/418 365/156 |

* cited by examiner

*Primary Examiner* — Michael Tran
(74) *Attorney, Agent, or Firm* — F. Chau & Associates, LLC

(57) ABSTRACT

A semiconductor memory device including: a first transistor connected between a first node and ground, the first transistor having a gate connected to a second node; a second transistor connected between the second node and ground, the second transistor having a gate connected to the first node; a third transistor connected between first and third nodes, the third transistor having a gate connected to the second node; a fourth transistor connected between second and fourth nodes, the fourth transistor having a gate connected to the first node; a fifth transistor connected between the first node and bit line, the fifth transistor having a gate connected to a word line; a sixth transistor connected between the second node and complementary bit line, the sixth transistor having a gate connected to the word line; and a circuit to reduce a gate-source voltage of the third or fourth transistor in a write operation.

17 Claims, 11 Drawing Sheets

US 10,049,728 B2

SEMICONDUCTOR MEMORY DEVICE HAVING BIT CELLS

CROSS-REFERENCE TO RELATED APPLICATION

This U.S. non-provisional patent application claims priority under 35 U.S.C. § 119 to Korean Patent Application No. 10-2016-0113339, filed on Sep. 2, 2016, the disclosure of which is incorporated by reference herein in its entirety.

TECHNICAL FIELD

The inventive concept relates to semiconductor memory devices, and more particularly, to a semiconductor memory device having a bit cell.

DISCUSSION OF RELATED ART

A semiconductor memory device may be a static random access memory (SRAM) or a dynamic random access memory (DRAM). The SRAM stores data using a latch and the DRAM stores data using a capacitor. The SRAM has a small memory capacity as compared with the DRAM. The SRAM is mainly used as a cache memory.

As semiconductor processes continue to develop, a semiconductor integrated circuit with a low power supply voltage is used to make a low power high efficiency system on chip (SoC). To use the low power SoC, a minimum operation voltage (VMIN) of an SRAM is lowered. However, stability of the SRAM may not be secured by a low power supply voltage.

SUMMARY

Exemplary embodiments of the inventive concept provide a semiconductor memory device. The semiconductor memory device may include a first transistor connected between a first node and a ground terminal, the first transistor having a gate connected to a second node, a second transistor connected between the second node and the ground terminal, the second transistor having a gate connected to the first node, a third transistor connected between the first node and a third node, the third transistor having a gate connected to the second node, a fourth transistor connected between the second node and a fourth node, the fourth transistor having a gate connected to the first node, a fifth transistor connected between the first node and a bit line, the fifth transistor having a gate connected to a word line, a sixth transistor connected between the second node and a complementary bit line, the sixth transistor having a gate connected to the word line, and a circuit configured to reduce a gate-source voltage of the third transistor or the fourth transistor in a write operation.

Exemplary embodiments of the inventive concept provide a semiconductor memory device. The semiconductor memory device may include a plurality of bit cells connected to a bit line and a complementary bit line; and write drivers connected to the bit line and the complementary bit line. Each of the bit cells is connected to a corresponding word line. At least one of the bit cells comprises a first transistor connected between a first node and a ground terminal, the first transistor having a gate connected to a second node, a second transistor connected between the second node and the ground terminal, the second transistor having a gate connected to the first node, a third transistor connected between the first node and a third node, the third transistor having a gate connected to the second node, a fourth transistor connected between the second node and a fourth node, the fourth transistor having a gate connected to the first node, a fifth transistor connected between the first node and a bit line, the fifth transistor having a gate connected to a word line to which the at least one bit cell is connected, a sixth transistor connected between the second node and a complementary bit line, the sixth transistor having a gate connected to the word line, and a circuit configured to reduce a voltage supplied to the first node or the second node in a write operation.

Exemplary embodiments of the present inventive concept provide a semiconductor memory device. The semiconductor memory device may include a data pass circuit connected to a first bit line, a second bit line and a word line; and a cross-coupled inverter connected to the data pass circuit, the cross-coupled inverter including: a pull up circuit and a pull down circuit connected to each other via a first node and a second node, the pull up circuit including a write circuit, a first transistor connected to the first node and the write circuit, a gate of the first transistor being connected to the second node, and a second transistor connected to the second node and the write circuit, a gate of the second transistor being connected to the first node, the write circuit including a third transistor connected between the first transistor and power supply voltage terminal, a gate of the third transistor being connected to the gate of the first transistor, the write circuit further including a fourth transistor connected between the second transistor and the power supply voltage terminal, a gate of the fourth transistor being connected to the gate of the second transistor.

DETAILED DESCRIPTION OF THE EMBODIMENTS

Figure 1:
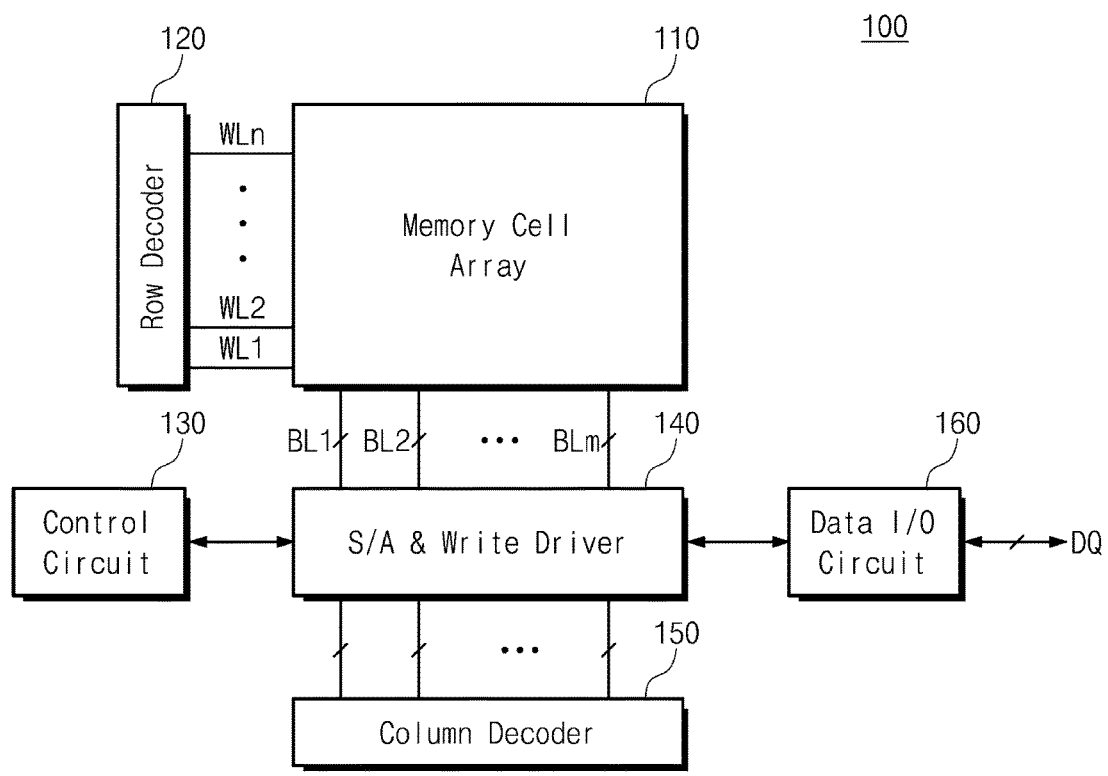
FIG. 1 is a block diagram of a semiconductor memory device according to an exemplary embodiment of the inventive concept.

Exemplary embodiments of inventive concept will be described more fully hereinafter with reference to the accompanying drawings. This inventive concept may, however, be embodied in many different forms and should not be construed as limited to the embodiments set forth herein. In the drawings, the size and relative sizes of layers and regions may be exaggerated for clarity. Like numbers may refer to like elements throughout the specification.

FIG. 1 is a block diagram of a semiconductor memory device according to an exemplary embodiment of the inventive concept. Referring to FIG. 1, a semiconductor memory device 100 may include a memory cell array 110, a row decoder 120, a control circuit 130, a sense amplifier and write driver 140, a column decoder 150, and a data input/output (I/O) circuit 160.

The memory cell array 110 may include a plurality of word lines (WL1 to WLn; n is an integer greater than or equal to 2), a plurality of bit lines (BL1 to BLm; m is an integer greater than or equal to 2), and a plurality of memory cells for storing data. Each of the bit lines (BL1 to BLm) may include a bit line and a complementary bit line.

The row decoder 120 may decode a row address and may selectively drive one word line among the word lines (WL1 to WLn) according to a decoding result.

The control circuit 130 may control an operation of the sense amplifier and write driver 140 based on a control signal being input from outside the semiconductor memory device 100, for example.

The sense amplifier and write driver 140 may perform a function of a write driver that writes data DQ input through the data input/output circuit 160 to the memory cell array 110 during a write operation.

The sense amplifier and write driver 140 may perform a function of a sense amplifier that sense-amplifies data output from the memory cell array 110 and transmits the amplified data to the data input/output circuit 160. For example, the sense amplifier and write driver 140 may include a plurality of sense amplifiers respectively configured to sense-amplify data from the bit lines (BL1 to BLm). Each of the sense amplifiers may sense-amplify data of each of the bit lines (BL1 to BLm) in response to a control signal output from the control circuit 130. The data sensed by the sense amplifier and write driver 140 may be output as data DQ from the data input/output circuit 160, for example.

Figure 2:
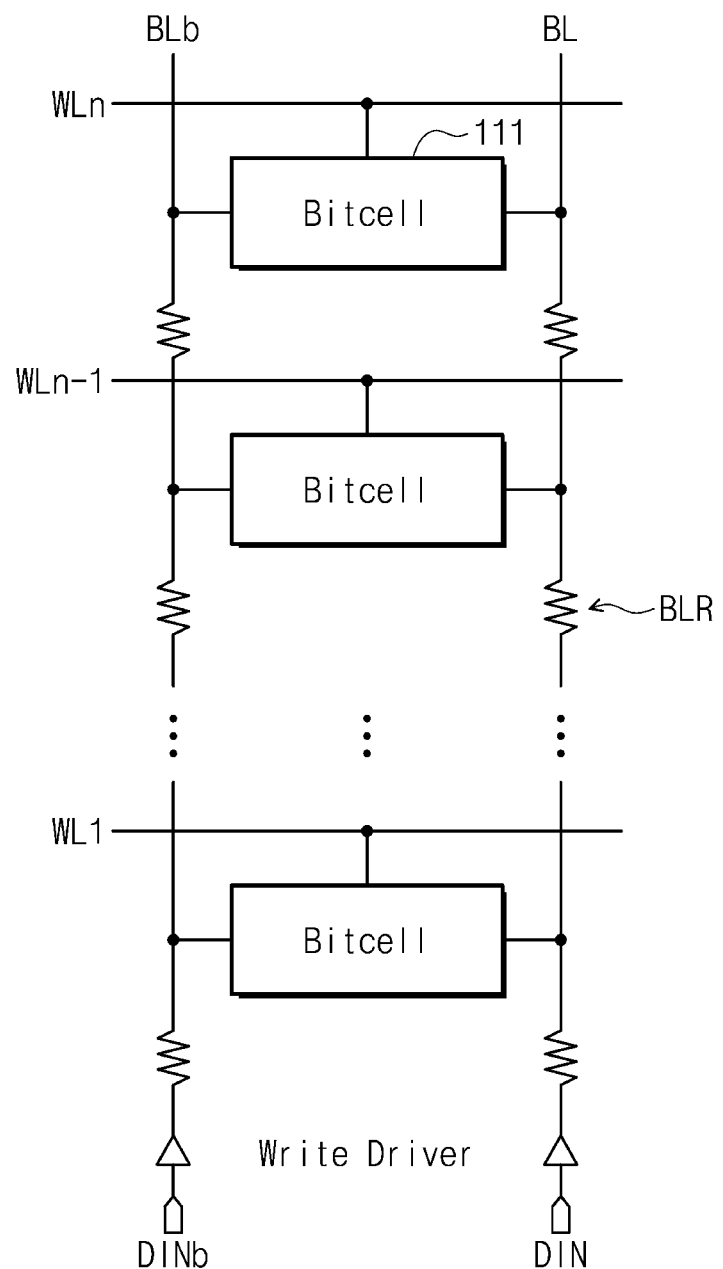
FIG. 2 is a view of a memory cell with a differential bit line structure in a semiconductor memory device illustrated in FIG. 1.

FIG. 2 is a view of a memory cell 111 of a differential bit line structure in a semiconductor memory device illustrated in FIG. 1. For convenience of description, it is assumed that the memory cell 111 is a static random access memory (SRAM) bit cell.

In a write operation, data of the SRAM may be determined according to driver strength of a cross-coupled inverter and a write driver of the bit cell 111. This structure is weak on the speed side and has a characteristic where incorrect data is stored when using a low power supply voltage which is sensitive to a process variation. As illustrated in FIG. 2, in the case where bit lines BL and BLb (BLb being the complementary bit line to BL) increase in length due to an increase of resistance of a metal in a fine process, an output of a write driver may not be properly transmitted to the bit cell 111. This is because of a relatively large bit line resistance (BLR). In FIG. 2, inputs to the bit lines BL and BLb are represented as DIN and DINb, respectively.

The bit cell according to an exemplary embodiment of the inventive concept that will be described below is able to operate with a low power supply voltage and increase write ability.

Figure 3:
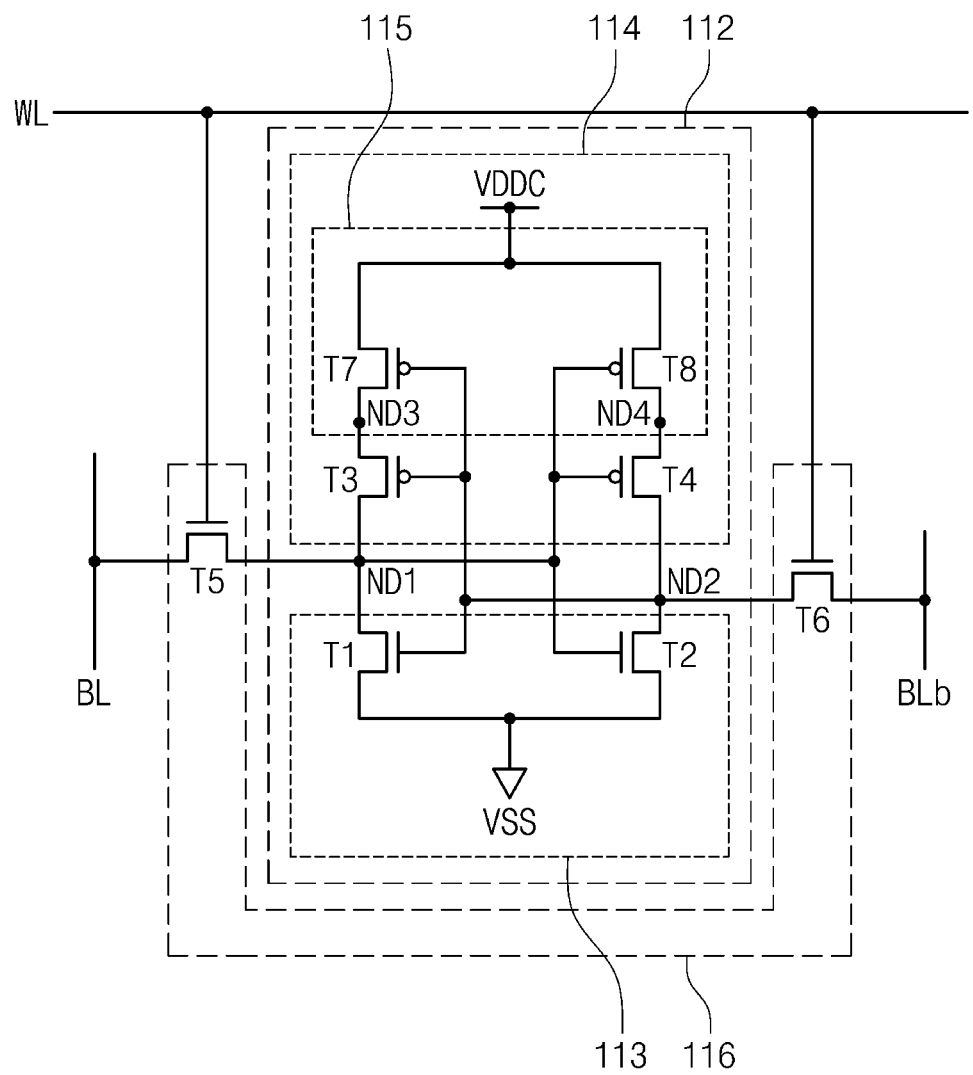
FIG. 3 is a view illustrating a memory cell according to an exemplary embodiment of the inventive concept.

FIG. 3 is a view illustrating a memory cell 111 according to an exemplary embodiment of the inventive concept. Referring to FIG. 3, the memory cell 111 may be constituted by eight transistors (T1 to T8). The memory cell 111 may include a cross-coupled inverter 112 (T1 to T4, T7, T8) and a data pass circuit 116 (T5, T6).

The cross-coupled inverter 112 may be connected between a first node ND1 and a second node ND2. The first node ND1 is a node to which a voltage corresponding to data (DATA) is transmitted and the second node ND2 is a node to which a voltage corresponding to complementary data (DATAB) is transmitted. In an exemplary embodiment of the inventive concept, the data (DATA) may be "1" and the complementary data (DATAB) may be "0". Alternatively, the data (DATA) may be "0" and the complementary data (DATAB) may be "1".

The cross-coupled inverter 112 may include a pull-down circuit 113 (T1, T2) and a pull-up circuit 114 (T3, T4, T7, T8).

The pull-down circuit 113 may include a first transistor T1 connected between the first node ND1 and a ground terminal VSS and a second transistor T2 connected between the second node ND2 and the ground terminal VSS. A gate of the first transistor T1 may be connected to the second node ND2 and a gate of the second transistor T2 may be connected to the first node ND1. Each of the transistors (T1, T2) constituting the pull-down circuit 13 may be a negative channel metal oxide semiconductor (NMOS) transistor.

The pull-up circuit 114 may include a third transistor T3 connected to the first node ND1, a fourth transistor T4 connected to the second node ND2, a seventh transistor T7 connected between one end of the third transistor T3 and a power supply terminal VDDC, and an eighth transistor T8 connected between one end of the fourth transistor T4 and the power supply terminal VDDC. A gate of the third transistor T3 and a gate of the seventh transistor T7 may be connected to the second node ND2, and a gate of the fourth transistor T4 and a gate of the eighth transistor T8 may be connected to the first node ND1.

Each of the transistors (T3, T4, T7, T8) constituting the pull-up circuit 114 may be a positive channel metal oxide semiconductor (PMOS) transistor.

The pull-up circuit 114 may include a write enhancement circuit 115 that enhances writing in a write operation. The write enhancement circuit 115 may be used to reduce a variation of a pull-up voltage, in other words, a gate-source voltage of the third transistor T3 and/or the fourth transistor T4. The write enhancement circuit 115 may include the seventh transistor T7 and the eighth transistor T8.

The data pass circuit 116 (T5, T6) may include a fifth transistor T5 connecting the bit line BL and the first node ND1 to each other in response to a voltage of the word line WL and a sixth transistor T6 connecting the complementary bit line BLb and the second node ND2 to each other in response to a voltage of the word line WL. The data pass circuit 116, in a write operation, may transmit a voltage of the bit line BL and a voltage of the complementary bit line BLb to the first node ND1 and the second node ND2 respectively. The data pass circuit 116, in a read operation, may transmit a voltage of the first node ND1 and a voltage of the second node ND2 to the bit line BL and the complementary bit line BLb respectively.

Each of the transistors (T5, T6) constituting the data pass circuit 116 may be an NMOS transistor.

As illustrated in FIG. 3, the pull-up circuit of the memory cell 110 may be embodied by two pairs of stacked transistors (T3/T7, T4/T8). Accordingly, the memory cell 111 may have increased write performance and increased read stability as compared with a conventional memory cell. This is because, a size of transistors constituting a pull-up circuit becomes large, and thus, a variation of a pull-up voltage is reduced. Because of the pairs of stacked transistors (T3/T7, T4/T8), a leakage current may be reduced and write performance may be increased.

The memory cell according to an exemplary embodiment of the inventive concept may be embodied with a separate signal line to increase write performance, for example.

Figure 4:
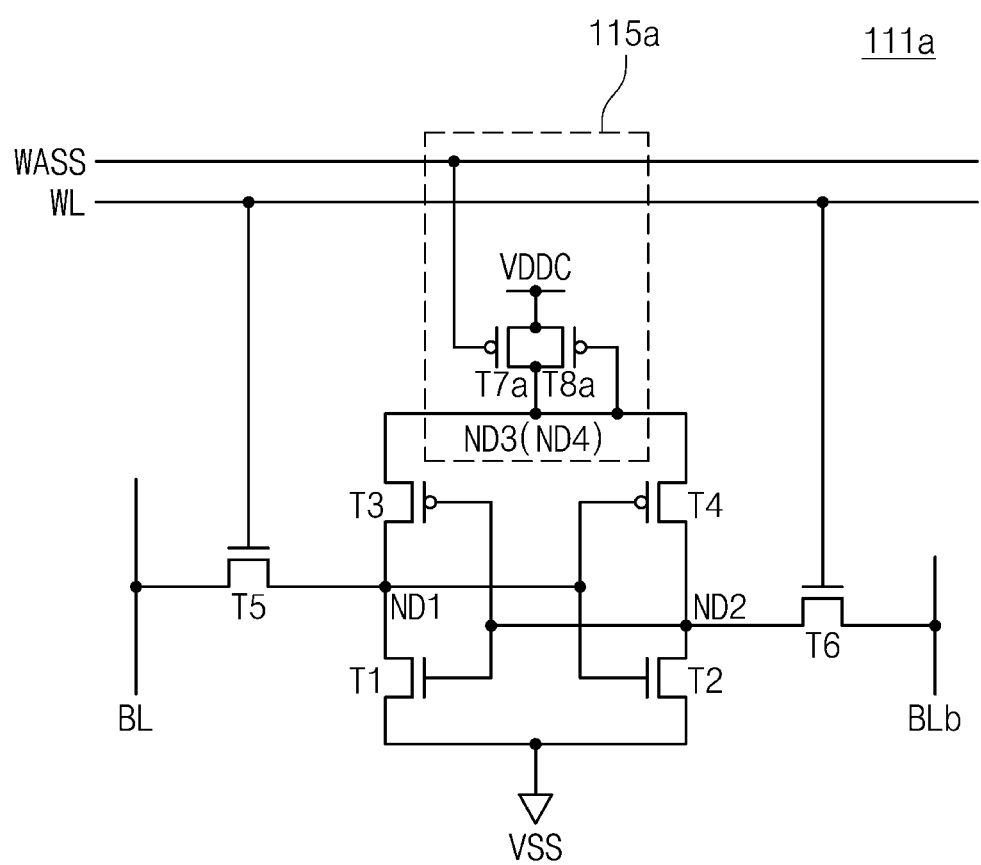
FIG. 4 is a view illustrating a memory cell according to an exemplary embodiment of the inventive concept.

FIG. 4 is a view illustrating a memory cell 111a according to an exemplary embodiment of the inventive concept. Referring to FIG. 4, the memory cell 111a may include a write enhancement circuit 115a having a different connection relation of seventh and eighth transistors (T7a, T8a) as compared with the memory cell 111 illustrated in FIG. 3. The remaining transistors (T1 to T6) may be connected the same way.

As illustrated in FIG. 4, the seventh transistor T7a may be connected between a power supply terminal VDDC and a third node ND3 and the eighth transistor T8a may be connected between the power supply terminal VDDC and the third node ND3. Here, one end of the third transistor T3 and one end of the fourth transistor T4 may be connected to the third node ND3 in common.

A gate of the seventh transistor T7a may be connected to a write auxiliary line WASS and a gate of the eighth transistor T8a may be connected to the third node ND3. Each of the seventh and eighth transistors (T7a, T8a) may be a PMOS transistor.

In a write operation of the memory cell 111a of FIG. 4, write performance can be increased as follows. A voltage (e.g., a high level voltage) that turns off the seventh transistor T7a may be applied to the write auxiliary line WASS in a write operation. At this time, the eighth transistor T8a may function as a diode connected to the power supply terminal VDDC. As a result, it looks as if a level of a power supply voltage supplied to the power supply terminal VDDC decreases. This can increase a data flip time of the cross-coupled inverter.

For example, in the case of a selected memory cell, a voltage of a high level may be applied to the auxiliary line WASS and a voltage of a low level may be applied to the bit line BL. Thus, the seventh transistor T7a is turned off and the eighth transistor T8a performs a diode function, thereby decreasing a gate-source voltage of the pull-up transistor (T3/T4).

In the case of the remaining memory cells, in other words, a selected read cell, a half-selected cell, and an unselected cell, a voltage of the low level is applied to the write auxiliary line WASS, and thus, there is no additional change in operation.

The memory cells according to exemplary embodiments of the inventive concept may use a voltage of a bit line to increase write performance, for example.

Figure 5:
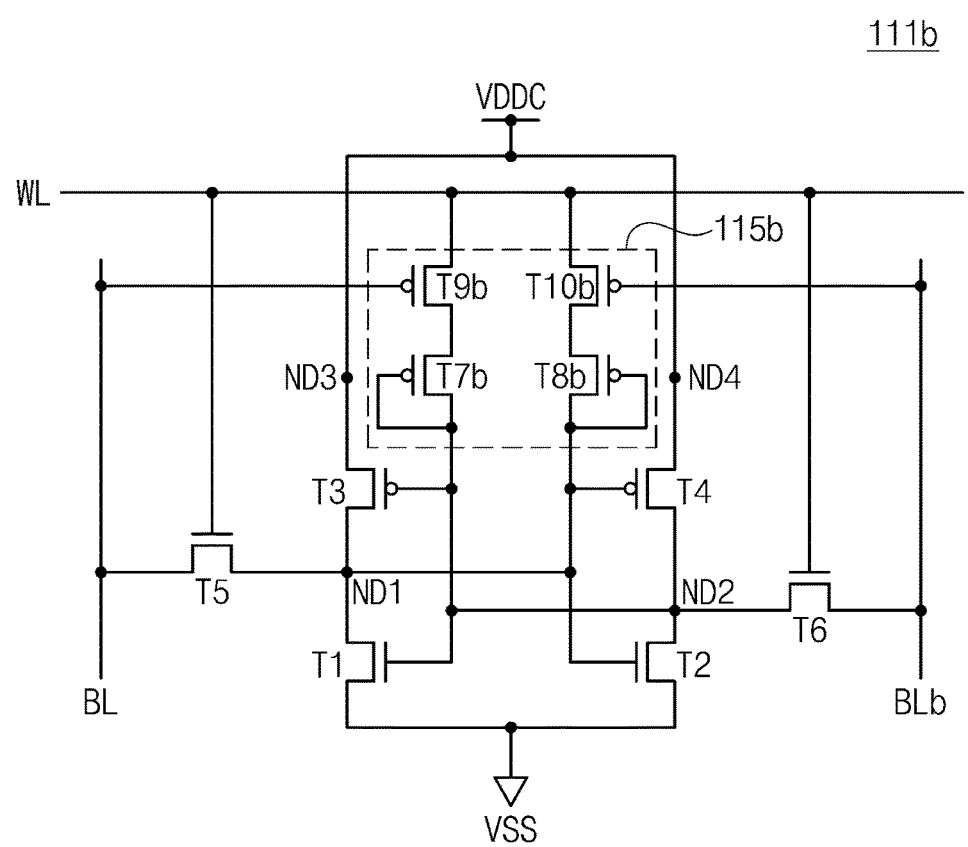
FIG. 5 is a view illustrating a memory cell according to an exemplary embodiment of the inventive concept.

FIG. 5 is a view illustrating a memory cell 111b according to an exemplary embodiment of the inventive concept. Referring to FIG. 5, the memory cell 111b may include a write enhancement circuit 115b constituted by seventh through tenth transistors (T7b, T8b, T9b, T10b) different from the write enhancement circuit 115 of the memory cell 111 illustrated in FIG. 3. In FIG. 5, transistors T1 to T6 may be the same as those in FIG. 3.

As illustrated in FIG. 5, the seventh transistor T7b may be diode-connected to a second node ND2 and the eighth transistor T8b may be diode-connected to a first node ND1.

The ninth transistor T9b may be connected between a word line WL and one end of the seventh transistor T7b. The ninth transistor T9b may be turned on/off depending on a voltage level of a bit line BL.

The tenth transistor T10b may be connected between the word line WL and one end of the eighth transistor T8b. The tenth transistor T10b may be turned on/off depending on a voltage level of a complementary bit line BLb.

For convenience of description, it is assumed that each of the seventh through tenth transistors (T7b, T8b, T9b, T10b) is a PMOS transistor.

A write operation of the memory cell 111b may increase write performance as follows. In the case of a selected memory cell, a voltage of a low level is applied to the bit line BL, and thus, the ninth transistor T9b is turned on and the seventh transistor T7b may function as a diode. As a result, a gate-source voltage of the pull-up transistor (T3/T4) may become small. Moreover, a data flip time may become much faster.

In the case of an unselected memory cell, because of a voltage of a low level applied to a word line WL and the diode-coupled transistors (T7b, T8b), data is maintained without error.

In the case of a selected read cell and a half-selected cell, since complementary data is "0", the complementary bit line BLb may be discharged. Thus, a gate-source voltage of the tenth transistor T10b connected to the complementary bit line BLb may gradually increase. A "1" level of data DATA may decrease.

In the case of an unselected cell of a different column, because of the voltage of the low level applied to the word line WL and the diode-coupled transistors (T7b, T8b), complementary data DATAB may not be changed.

The memory cells illustrated in FIGS. 3 to 5 increase write performance by strengthening a function of a pull-up circuit in a write operation. The inventive concept is not limited thereto. For example, a memory cell according to an exemplary embodiment of the present inventive concept may increase write performance by strengthening a cross coupling function in a write operation.

Figure 6:
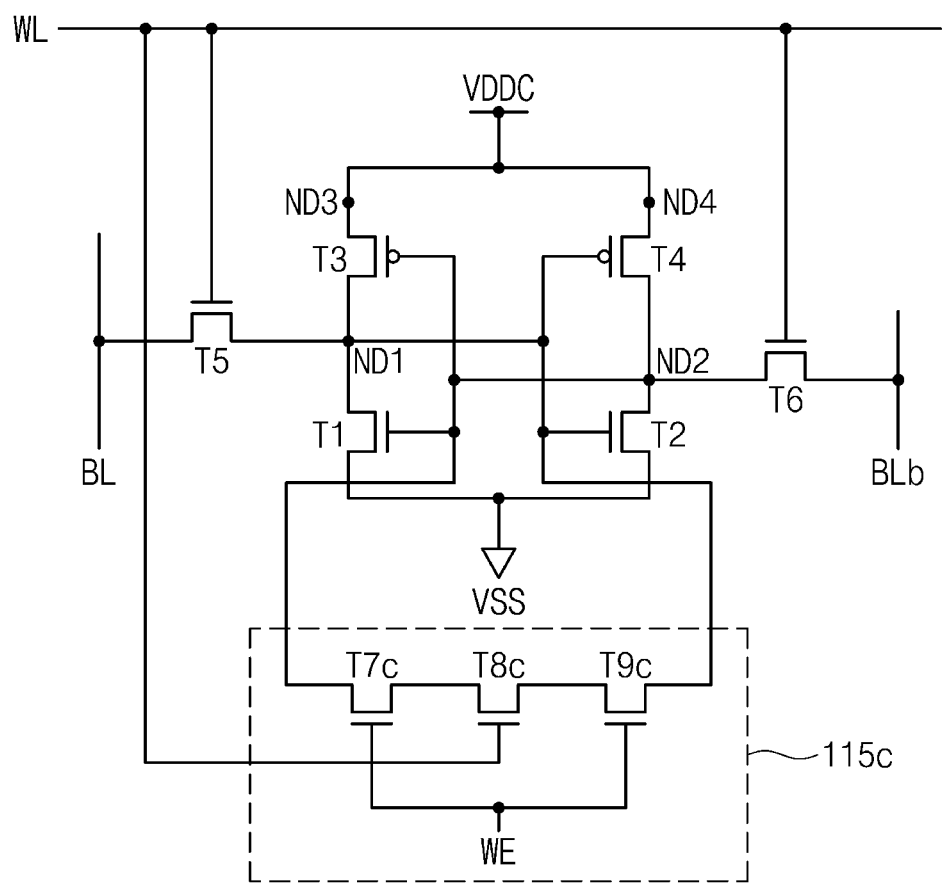
FIG. 6 is a view illustrating a memory cell according to an exemplary embodiment of the inventive concept.

FIG. 6 is a view illustrating a memory cell 111c according to an exemplary embodiment of the inventive concept. Referring to FIG. 6, the memory cell 111c may include the same transistors (T1 to T6) as shown in FIG. 3. Still referring to FIG. 6, the memory cell 111c may include a write enhancement circuit 115c constituted by seventh through ninth transistors (T7c, T8c, T9c) that reset a first node ND1 and a second node ND2 to strengthen a cross-coupling function, for example.

As illustrated in FIG. 6, the seventh through ninth transistors (T7c, T8c, T9c) may be serially connected between the first node ND1 and the second node ND2. A gate of the seventh transistor T7c and a gate of the ninth transistor T9c may receive a write activation signal WE. A gate of the eighth transistor T8c may be connected to a word line WL.

Each of the seventh through ninth transistors (T7c, T8c, T9c) may be an NMOS transistor. However, the inventive concept is not limited thereto.

A write operation of the memory cell 111c will be described below.

In the case where the memory cell 111c is a selected write cell, a voltage of a high level is applied to the word line WL and the eighth transistor T8c may be turned on. Since the write activation signal WE has the high level, the seventh transistor T7c and the eighth transistor T8c may both be turned on. Thus, a voltage of the first node ND1 may be the same as a voltage of the second node ND2. In this case, a gate-source voltage of the pull-up transistors (T3, T4) may become small. Thus, a data flip time may become fast.

In the case of an unselected cell of the same column to which the memory cell 111c is connected, since a voltage of a low level is applied to the word line WL, even if the write activation signal WE has the high level, data is maintained without error.

In the case where the memory cell 111c is a read cell and a half-selected cell, since the write activation signal WE has a low level, the seventh transistor T7c and the ninth transistor T9c may be turned off. Thus, this additional circuit (e.g., the write enhancement circuit 115c) does not have an effect on a read operation.

In the case of an unselected cell of a different column, since a voltage of a low level is applied to the word line WL and the write activation signal WE has the low level, data is maintained without error.

The memory cell 111c performs a write operation after resetting (e.g., a short of the first node ND1 and the second node ND2) stored data in the write operation, thereby maximizing write performance.

The memory cell according to an exemplary embodiment of the inventive concept may remove the ninth transistor T9c from the memory cell 111c illustrated in FIG. 6.

The memory cell according to an exemplary embodiment of the inventive concept may cut a pass connected to the power supply terminal VDDC to increase write performance in a write operation and to have a separate current pass for a write operation, for example.

Figure 7:
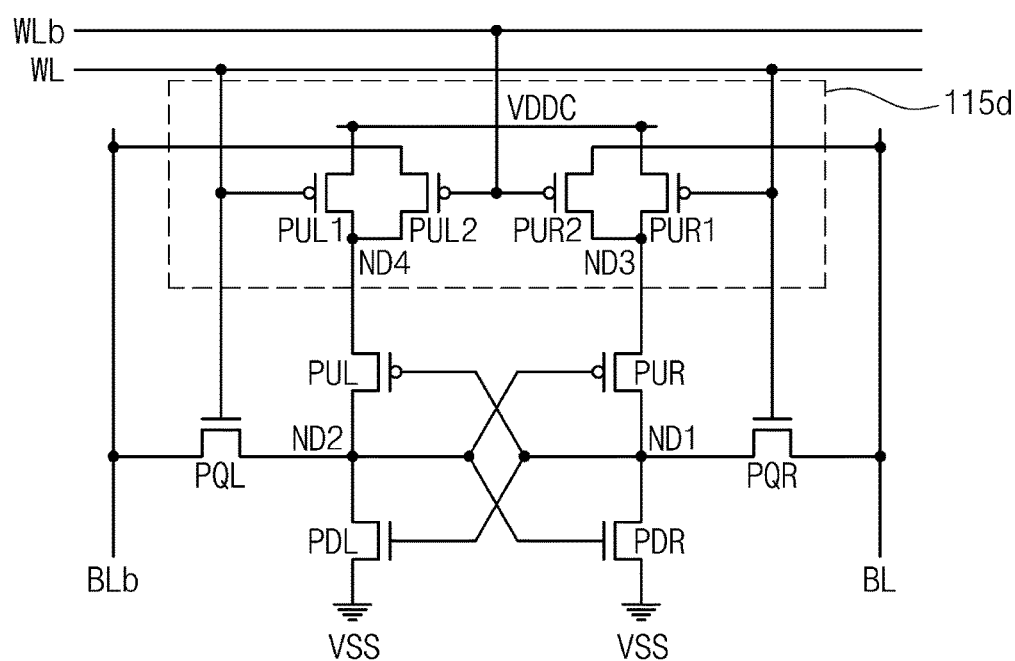
FIG. 7 is a view illustrating a memory cell according to an exemplary embodiment of the inventive concept.

FIG. 7 is a view illustrating a memory cell 111d according to an exemplary embodiment of the inventive concept. Referring to FIG. 7, the memory cell 111d may include transistors (PDL, PDR, PUL, PUR) constituting a cross-coupled inverter between a first node ND1 and a second node ND2, transistors (PQL, PQR) constituting a data pass circuit, and a write enhancement circuit 115d constituted by transistors (PUL1, PUL2, PUR1, PUR2) that cut a pass connected to a power supply terminal VDDC and form a current pass to a bit line BL and a complementary bit line BLb in a write operation. The transistors (PDL, PDR, PUL, PUR, PQL, PQR) may correspond to the transistors (T1 to T6) of FIG. 3. As illustrated in FIG. 7, a complementary word line WLb may be further included to form a current pass by being connected to the bit line BL/complementary bit line BLb in a write operation.

The transistor PUL1 may be connected between the power supply terminal VDDC and one end of the transistor PUL. A gate of the transistor PUL1 may be connected to the word line WL.

The transistor PUL2 may be connected between the complementary bit line BLb and one end of the transistor PUL. A gate of the transistor PUL2 may be connected to the complementary word line WLb.

The transistor PUR1 may be connected between the power supply terminal VDDC and one end of the transistor PUL. A gate of the transistor PUR1 may be connected to the word line WL.

The transistor PUR2 may be connected between the bit line BL and one end of the transistor PUR. A gate of the transistor PUR2 may be connected to the complementary word line WLb.

Each of the transistors (PUL1, PUL2, PUR1, PUR2) may be a PMOS transistor. However, the inventive concept is not limited thereto.

An operation of the memory cell 111d is as follows.

In the case where the memory cell 111d is a selected cell, since a voltage of a high level is applied to the word line WL in a write operation, the transistor PUL1 and the transistor PUR1 may be turned off. Since a voltage of a low level is applied to the complementary word line WLb, the transistor PUL2 and the transistor PUR2 may be turned on. Since a voltage of a low level is applied to the bit line BL, a source-gate voltage of the pull-up transistor PUL may become small. Thus, a data flip time may become faster.

In the case of an unselected cell of the same column or different column, since the transistor PUL1 and the transistor PUR1 are turned on and the transistor PUL2 and the transistor PUR2 are turned off, data is maintained without error.

In the case where the memory cell 111d is a read cell or a half-selected cell, since a voltage of a second node ND2 is a low level, the complementary bit line BLb may be discharged. Since the pull-up transistor PUR is cut off, the possibility that a level of the second node ND2 increases may be reduced.

The memory cell 111d has a structure obtained by adding four transistors (PUL1, PUL2, PUR1, PUR2) and a signal line WLb to a general structure of a memory cell using six transistors. A signal (WL=high, WLb=low) may be applied in a state where a bit cell is not selected. In this case, the transistors (PUL2, PUR2) are turned off and the transistors (PUL1, PUR1) are turned on and thereby data of the nodes (ND1, ND2) may be maintained.

In the case where a bit cell is selected, in other words, WL becomes a high state and WLb becomes a low state, the transistors (PUL1, PUR1) are turned off and thereby a current path through which the transistors (PUL, PUR) receive a current from the power supply terminal VDDC may be blocked. Thus, in a node having stored data of "1" among the nodes (ND1, ND2), the stored data of "1" may be changed to data of "0" only by a write driver in a floating state. This can increase write ability in a low power supply voltage state regardless of a drive ability of the pull-up transistors (PUL, PUR) and the pass gate transistors (PQL, PQR), as well as a high metal resistance of the bit line.

The pull-up transistors (PUL2, PUR2) can reduce write time by providing an additional path besides a path provided by the pass gate transistors (PQL, PQR). In addition, the pull-up transistors (PUL2, PUR2) can prevent the stored data from being flipped by increasing a voltage difference ($|V(ND2)-V(ND1)|$) between the first node ND1 and the second node ND2 by as much as a power supply voltage VDDS. For example, when the bit line is driven to "0" by the write driver in a state where ND1="1" and ND2="0", data of the first node ND1 may be discharged faster by the pull-up transistors (PUR, PUR2).

When the first node ND1 is charged only by the pass gate transistor PQL, which is an NMOS transistor, in a situation where the first node ND1 is being charged to "1", a voltage of the first node ND1 is limited to VDDS−Vth, and thus, ($|V(ND2)-V(ND1)|$) may become equal to VDDS−Vth. However, since a voltage of the second node ND2 can rise to the power supply voltage VDDS by virtue of the transistors (PUL2, PUL) which are PMOS transistors, normal operation is possible at a low power supply voltage ($VDDS=|V(ND2)-V(ND1)|$).

The memory cell 111d can increase both write performance and read stability by including the transistors (PUL1, PUR1) controlled by the word line WL and the transistors (PUL2, PUR2) controlled by the complementary word line WLb, the bit line BL, and the complementary bit line BLb, for example.

Figure 8:
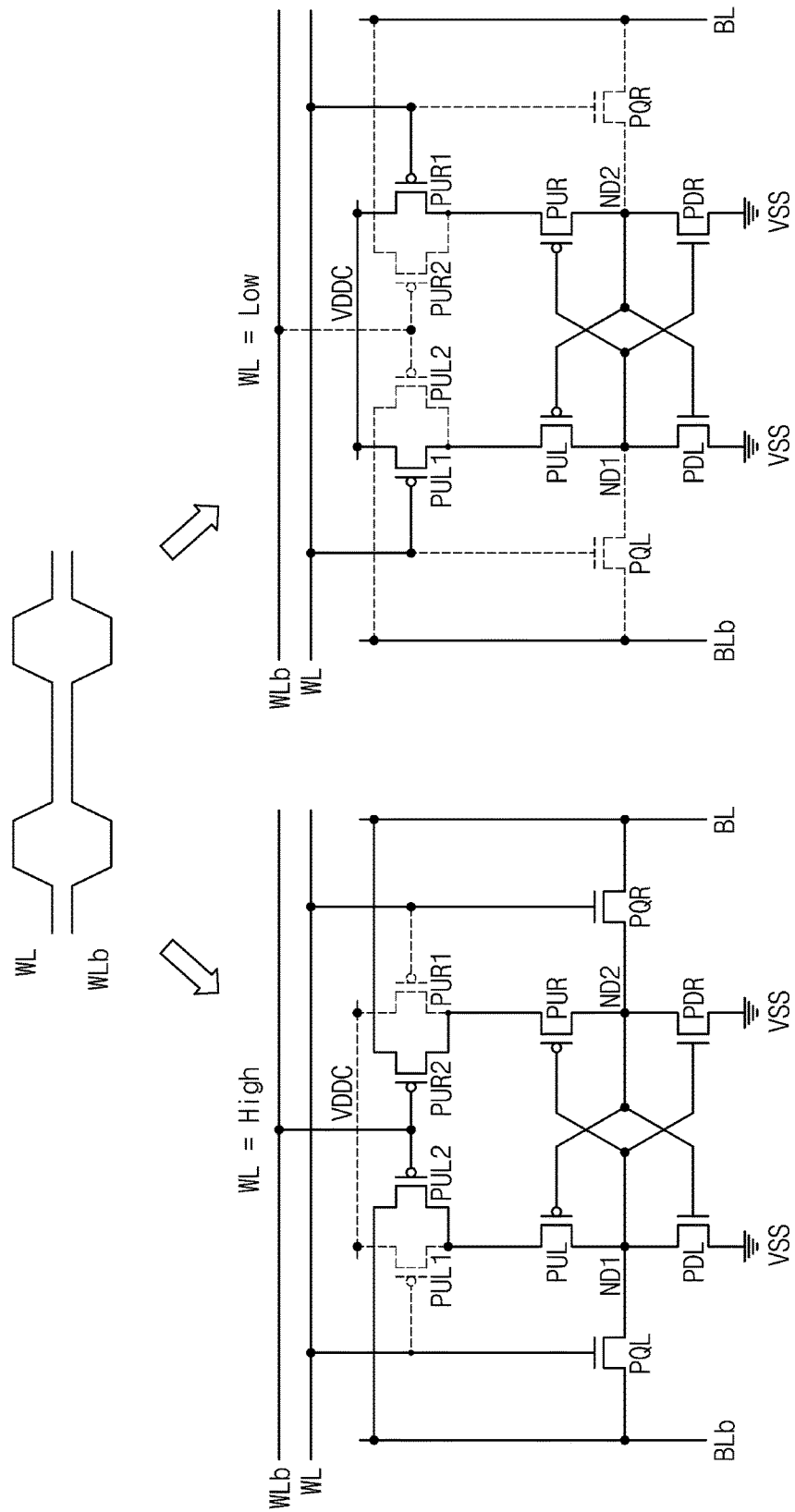
FIG. 8 is a view illustrating an operation according to a level of a word line in a memory cell illustrated in FIG. 7 according to an exemplary embodiment of the inventive concept.

FIG. 8 is a view illustrating an operation according to a level of a word line WL in the memory cell 111d illustrated in FIG. 7 according to an exemplary embodiment of the inventive concept. Referring to FIG. 8, when the word line WL has a high level, the transistors (PUL1, PUR1) are turned off (as indicated by the dashed lines) and the transistors (PUL2, PUR2) are turned on. Thus, a path of the power supply terminal VDDC is blocked from the memory cell 111d and a current path to the bit line BL and the complementary bit line BLb may be formed.

When the word line WL has a low level, the transistors (PUL1, PUR1) are turned on and the transistors (PUL2, PUR2) are turned off (as indicated by the dashed lines). Thus, a path of the power supply terminal VDDC is connected from the memory cell 111d and a current path to the bit line BL and the complementary bit line BLb may be blocked.

The memory cell according to an exemplary embodiment of the inventive concept may add a single ended read port to increase the immunity to read disturbance, for example.

Figure 9:
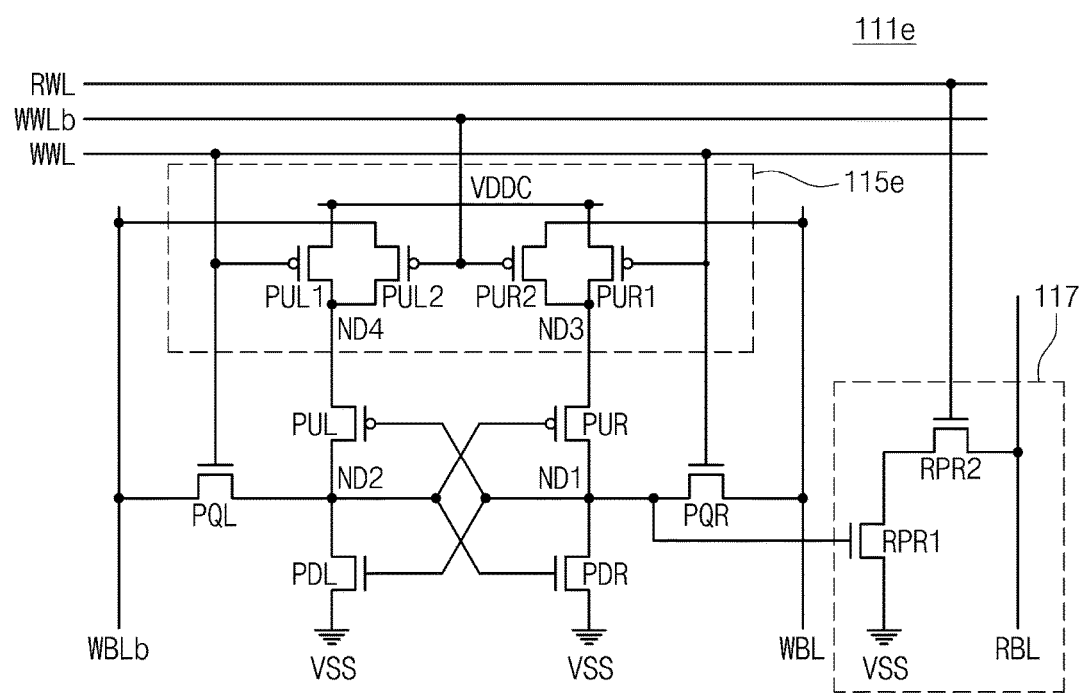
FIG. 9 is a view illustrating a memory cell according to an exemplary embodiment of the inventive concept.

FIG. 9 is a view illustrating a memory cell 111e according to an exemplary embodiment of the inventive concept. Referring to FIG. 9, the memory cell 111e may further include a single ended read port 117 as compared with the memory cell 111d illustrated in FIG. 7.

The single ended read port 117 may include first and second read port transistors (RPR1, RPR2). The first read port transistor RPR1 and the second read port transistor RPR2 may be serially connected between a read bit line RBL and a ground terminal VSS. A gate of the first read port transistor RPR1 may be connected to a second node ND2 and a gate of the second read port transistor RPR2 may be connected to a read word line RWL.

As illustrated in FIG. 9, the memory cell 111e may be connected to write word lines (WWL, WWLb), write bit lines (WBL, WBLb), the read word line RWL, and the read bit line RBL.

Figure 10:
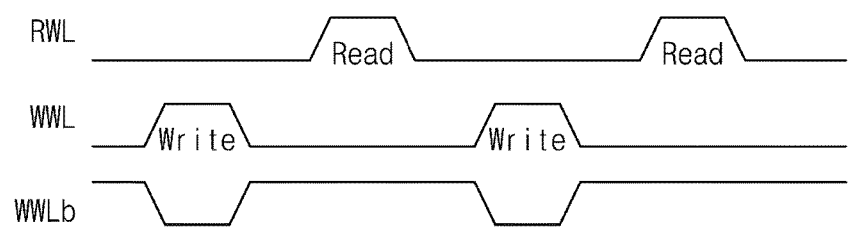
FIG. 10 is a view illustrating a level of a word line in a write/read operation of a memory cell illustrated in FIG. 9 according to an exemplary embodiment of the inventive concept.

FIG. 10 is a view illustrating a level of a word line in a write/read operation of the memory cell 111e illustrated in FIG. 9 according to an exemplary embodiment of the inventive concept. Referring to FIG. 10, in a write operation, the write word line WWL has a high level and the complementary write word line WWLb has a low level. In a read operation, the read word line RWL has a high level.

The memory cell 111e illustrated in FIG. 9 includes the single ended read port. However, the memory cell of the present inventive concept is not limited thereto. For example, a memory cell according to an exemplary embodiment of the present inventive concept may include a read port of a differential structure.

Figure 11:
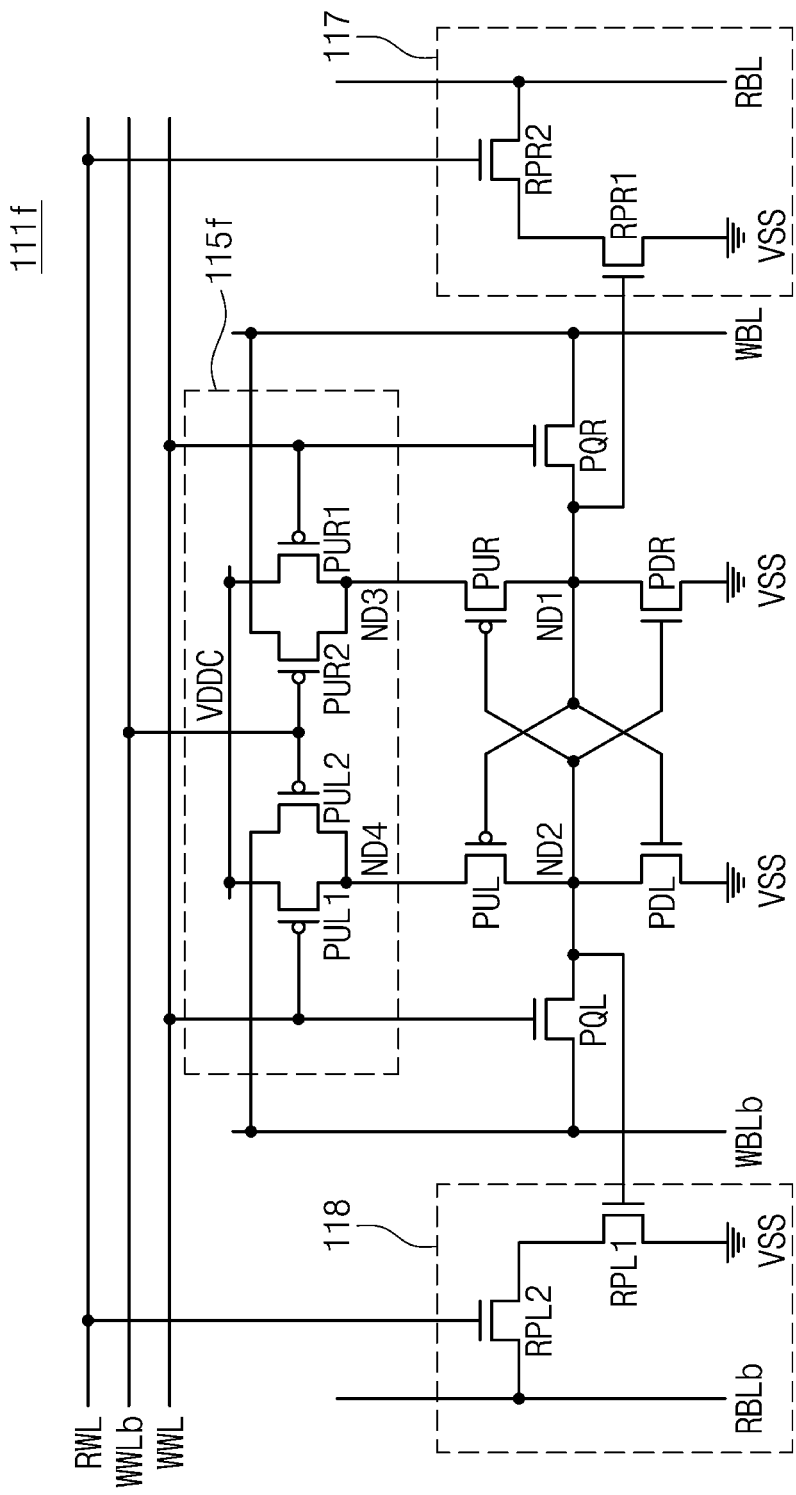
FIG. 11 is a view illustrating a memory cell according to an exemplary embodiment of the inventive concept.

FIG. 11 is a view illustrating a memory cell 111f according to an exemplary embodiment of the inventive concept. Referring to FIG. 11, the memory cell 111f may include a differential ended read ports 117 and 118 as compared with the memory cell 111e illustrated in FIG. 9.

The first ended read port 117 may be the same as that illustrated in FIG. 9.

The second ended read port 118 may include first and second read port transistors (RPL1, RPL2). The first read port transistor RPL1 and the second read port transistor RPL2 may be serially connected between a complementary read bit line RBLb and a ground terminal VSS. A gate of the first read port transistor RPL1 may be connected to a second node ND2 and a gate of the second read port transistor RPL2 may be connected to a read word line RWL.

Figure 12:
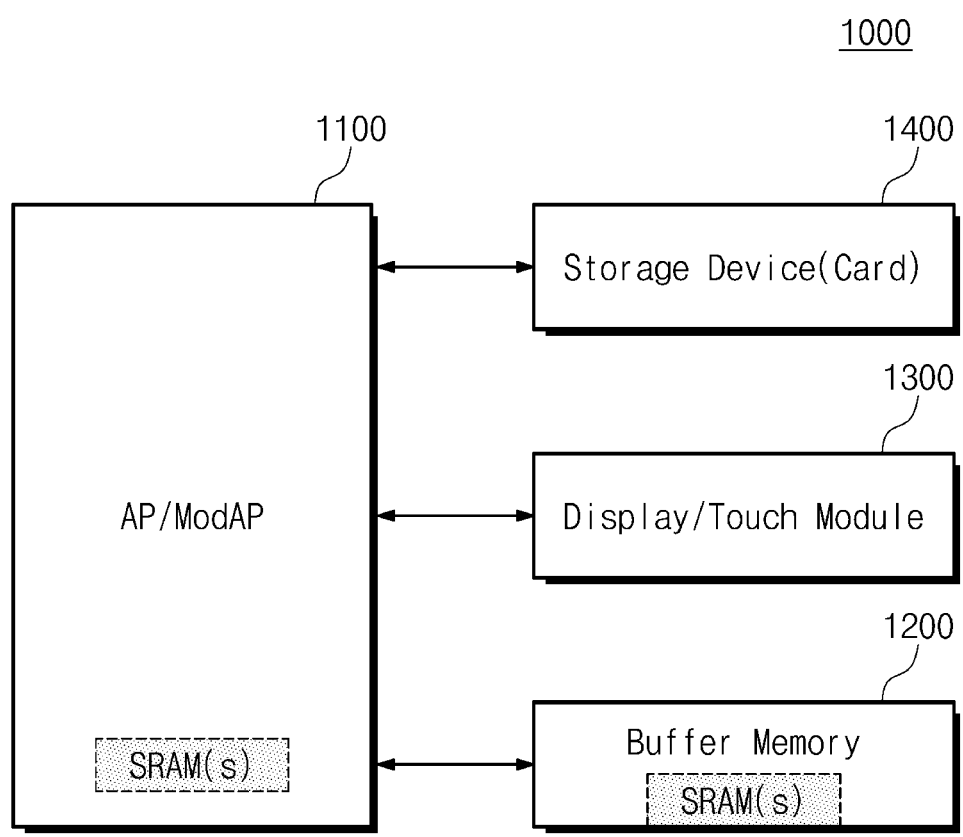
FIG. 12 is a view illustrating a mobile device using a static random access memory (SRAM) according to an exemplary embodiment of the inventive concept.

FIG. 12 is a view illustrating a mobile device 1000 using an SRAM according to an exemplary embodiment of the inventive concept. Referring to FIG. 12, the mobile device 1000 may include a processor (AP/ModAP) 1100, a buffer memory 1200, a display/touch module 1300, and storage device 1400.

The mobile device 1000 may further include a security chip. The chip and/or its security may be embodied in software and/or tamper resistant hardware, may allow a high level of security, and may work in cooperation with a trusted execution environment (TEE) of the processor 1100. The security chip may include a native operating system (OS), a security storage device which is an internal data storage area, an access control block that controls an access authority to the security chip, an ownership management, a key management, a digital signature, a security function block that performs encryption/decryption, and a firmware update block for updating firmware of the security chip. The security chip may be, for example, a universal integrated circuit card (UICC), e.g., a universal subscriber identity module (USIM), a CDMA SIM (CSIM), an IP multimedia services identity module (ISIM)), a subscriber identity module (SIM) card, an embedded secure elements (eSE), a Micro secure digital (SD), a Stickers, etc.

The processor 1100 may control an overall operation of the mobile device 1000 and a wired/wireless communication with the outside of the mobile device 1000. For example, the processor 1100 may be an application processor (AP) and an integrated modem application processor (ModAP). The processor 1100 may include the SRAM described in reference to FIGS. 1 thorough 11.

The buffer memory 1200 may store data needed in a processing operation of the mobile device 1000. The buffer memory 1200 may include the SRAM described in reference to FIGS. 1 thorough 11.

The display/touch module 1300 may display data processed in the processor 1100 or receive data from a touch panel. The storage device 1400 may store data of a user. The storage device 1400 may be an embedded multimedia card (eMMC), a solid state drive (SSD), a universal flash storage (UFS), etc.

The mobile device 1000 may have an increased overall performance by increasing write performance and maintaining read performance regardless of a low power supply voltage, in the manners described above.

A semiconductor memory device according to an exemplary embodiment of the inventive concept can reduce a gate-source voltage of a pull-up transistor corresponding to a data node in a write operation. As a result, the semiconductor memory device can maintain read stability while increasing write ability.

While the inventive concept has been described with reference to exemplary embodiments thereof, it will be apparent to those skilled in the art that various changes and modifications may be made thereto without departing from the spirit and scope of the inventive concept. Therefore, it should be understood that the above embodiments are not limiting, but illustrative.

What is claimed is:
1. A semiconductor memory device, comprising:
a first transistor connected between a first node and a ground terminal, the first transistor having a gate connected to a second node;

a second transistor connected between the second node and the ground terminal, the second transistor having a gate connected to the first node;
a third transistor connected between the first node and a third node, the third transistor having a gate connected to the second node;
a fourth transistor connected between the second node and a fourth node, the fourth transistor having a gate connected to the first node, and the third and fourth nodes are not directly connected to each other;
a fifth transistor connected between the first node and a bit line, the fifth transistor having a gate connected to a word line;
a sixth transistor connected between the second node and a complementary bit line, the sixth transistor having a gate connected to the word line; and
a circuit configured to reduce a gate-source voltage of the third transistor or the fourth transistor in a write operation.

2. The semiconductor memory device of claim 1, wherein the circuit comprises:
a seventh transistor connected between a power supply terminal and the third node, the seventh transistor having a gate connected to the second node; and
an eighth transistor connected between the power supply terminal and the fourth node, the eighth transistor having a gate connected to the first node.

3. The semiconductor memory device of claim 2, wherein each of the first transistor, the second transistor, the fifth transistor and the sixth transistor is a negative channel metal oxide semiconductor (NMOS) transistor, and
wherein each of the third transistor, the fourth transistor, the seventh transistor and the eighth transistor is a positive channel metal oxide semiconductor (PMOS) transistor.

4. The semiconductor memory device of claim 1, wherein the circuit comprises:
a seventh transistor connected between a power supply terminal and the third node, the seventh transistor having a gate connected to the word line;
an eighth transistor connected between the power supply terminal and the fourth node, the eighth transistor having a gate connected to the word line;
a ninth transistor connected between the bit line and the third node, the ninth transistor having a gate connected to a complementary word line; and
a tenth transistor connected between the complementary bit line and the fourth node, the tenth transistor having a gate connected to the complementary word line.

5. The semiconductor memory device of claim 4, wherein when the word line has a high level, the complementary word line has a low level, and when the word line has a low level, the complementary word line has a high level.

6. The semiconductor memory device of claim 4, further comprising a first read port having a first read port transistor and a second read port transistor that are connected between a read bit line and the ground terminal,
wherein a gate of the first read port transistor is connected to the first node and a gate of the second read port transistor is connected to a read word line.

7. The semiconductor memory device of claim 6, wherein the read word line has a high level in a read operation and has a low level in a write operation,
wherein the word line has a low level in the read operation and has a high level in the write operation, and
wherein the complementary word line has a high level in the read operation and has a low level in the write operation.

8. The semiconductor memory device of claim 6, further comprising a second read port having a third read port transistor and a fourth read port transistor that are connected between a complementary read bit line and the ground terminal,
wherein a gate of the third read port transistor is connected to the second node and a gate of the fourth read port transistor is connected to the read word line.

9. A semiconductor memory device, comprising:
a plurality of bit cells connected to a bit line and a complementary bit line; and
write drivers connected to the bit line and the complementary bit line,
wherein each of the bit cells is connected to a corresponding word line and at least one of the bit cells comprises:
a first transistor connected between a first node and a ground terminal, the first transistor having a gate connected to a second node;
a second transistor connected between the second node and the ground terminal, the second transistor having a gate connected to the first node;
a third transistor connected between the first node and a third node, the third transistor having a gate connected to the second node;
a fourth transistor connected between the second node and a fourth node, the fourth transistor having a gate connected to the first node;
a fifth transistor connected between the first node and a bit line, the fifth transistor having a gate connected to a word line to which the at least one bit cell is connected;
a sixth transistor connected between the second node and a complementary bit line, the sixth transistor having a gate connected to the word line; and
a circuit configured to reduce a voltage supplied to the first node or the second node in a write operation, where in the circuit comprises:
a seventh transistor connected between a power supply terminal and the third node, the seventh transistor having a gate connected to the word line; and
an eighth transistor connected between the power supply terminal and the fourth node, the eighth transistor having a gate connected to the word line.

10. The semiconductor memory device of claim 9, wherein the circuit comprises:
a ninth transistor connected between the bit line and the third node, the ninth transistor having a gate connected to a complementary word line; and
a tenth transistor connected between the complementary bit line and the fourth node, the tenth transistor having a gate connected to the complementary word line.

11. The semiconductor memory device of claim 10, wherein each of the first transistor, the second transistor, the fifth transistor and the sixth transistor is a negative channel metal oxide semiconductor (NMOS) transistor, and
wherein each of the third transistor, the fourth transistor, the seventh transistor, the eighth transistor, the ninth transistor, and the tenth transistor is a positive channel metal oxide semiconductor (PMOS) transistor.

12. The semiconductor memory device of claim 10, further comprising:
an eleventh transistor connected to the ground terminal, the eleventh transistor having a gate connected to the first node; and a twelfth transistor connected between an end of the eleventh transistor and a read bit line, the twelfth transistor having a gate connected to a read word line.

13. The semiconductor memory device of claim 10, further comprising:
   an eleventh transistor connected to the ground terminal, the eleventh transistor having a gate connected to the first node;
   a twelfth transistor connected between an end of the eleventh transistor and a read bit line, the twelfth transistor having a gate connected to a read word line;
   a thirteenth transistor connected to the ground terminal, the thirteenth transistor having a gate connected to the second node; and
   a fourteenth transistor connected between an end of the thirteenth transistor and a complementary read bit line, the fourteenth transistor having a gate connected to the read word line.

14. A semiconductor memory device, comprising:
   a data pass circuit connected to a first bit line, a second bit line and a word line; and
   a cross-coupled inverter connected to the data pass circuit, the cross-coupled inverter including:
   a pull up circuit and a pull down circuit connected to each other via a first node and a second node,
   the pull up circuit including a write circuit, a first transistor connected to the first node and the write circuit, a gate of the first transistor being connected to the second node, and a second transistor connected to the second node and the write circuit, a gate of the second transistor being connected to the first node,
   the write circuit including a third transistor connected between the first transistor and power supply voltage terminal, a gate of the third transistor being connected to the gate of the first transistor,
   the write circuit further including a fourth transistor connected between the second transistor and the power supply voltage terminal, a gate of the fourth transistor being connected to the gate of the second transistor.

15. The semiconductor memory device of claim 14, wherein the first, second, third and fourth transistors are positive channel metal oxide semiconductor transistors.

16. The semiconductor memory device of claim 15, wherein the pull down circuit includes negative channel metal oxide semiconductor transistors, and the data pass circuit includes negative channel metal oxide semiconductor transistors.

17. The semiconductor memory device of claim 14, wherein the cross-coupled inverter is a static random access memory (SRAM) bit cell.

* * * * *